(12) United States Patent
Wong et al.

(10) Patent No.: US 7,452,775 B2
(45) Date of Patent: Nov. 18, 2008

(54) NON-VOLATILE MEMORY DEVICE AND MANUFACTURING METHOD AND OPERATING METHOD THEREOF

(75) Inventors: Wei-Zhe Wong, Tainan (TW); Ching-Sung Yang, Hsinchu (TW); Chih-Chen Cho, Taipei (TW)

(73) Assignee: Powership Semiconductor Corp., Hsinchu (TW)

( * ) Notice: Subject to any disclaimer, the term of this patent is extended or adjusted under 35 U.S.C. 154(b) by 106 days.

(21) Appl. No.: 11/558,747

(22) Filed: Nov. 10, 2006

(65) Prior Publication Data

US 2007/0085124 A1    Apr. 19, 2007

Related U.S. Application Data

(62) Division of application No. 11/158,412, filed on Jun. 21, 2005, now Pat. No. 7,154,142.

(30) Foreign Application Priority Data

Jan. 3, 2005    (TW) ............................... 94100019 A

(51) Int. Cl.
*H01L 21/8247* (2006.01)

(52) U.S. Cl. ............................... 438/259; 257/E21.179; 438/954

(58) Field of Classification Search ......... 438/257–267, 438/954; 257/E21.179
See application file for complete search history.

(56) References Cited

U.S. PATENT DOCUMENTS

| 5,888,868 | A | 3/1999 | Yamazaki et al. | 438/258 |
| 7,154,142 | B2 * | 12/2006 | Wong et al. | 257/316 |
| 2004/0197994 | A1 | 10/2004 | Hung et al. | 438/257 |

FOREIGN PATENT DOCUMENTS

CN    1391286    1/2003

* cited by examiner

*Primary Examiner*—Richard A. Booth
(74) *Attorney, Agent, or Firm*—J.C. Patents

(57) ABSTRACT

A non-volatile memory device having a substrate, an n type well, a p type well, a control gate, a composite dielectric layer, a source region and a drain region is provided. A trench is formed in the substrate. The n type well is formed in the substrate. The p type well is formed in the substrate above the n type well. The junction of p type well and the n type well is higher than the bottom of the trench. The control gate which protruding the surface of substrate is formed on the sidewalls of the trench. The composite dielectric layer is formed between the control gate and the substrate. The composite dielectric layer includes a charge-trapping layer. The source region and the drain region are formed in the substrate of the bottom of the trench respectively next to the sides of the control gate.

7 Claims, 5 Drawing Sheets

NON-VOLATILE MEMORY DEVICE AND MANUFACTURING METHOD AND OPERATING METHOD THEREOF

CROSS-REFERENCE TO RELATED APPLICATION

This application is a divisional application of, and claims the priority benefit of, U.S. application Ser. No. 11/158,412 filed on Jun. 21, 2005 now U.S. Pat. No. 7,154,142, which claims the priority benefit of Taiwan application serial no. 94100019, filed on Jan. 3, 2005. All disclosure of the Taiwan application is incorporated herein by reference.

BACKGROUND OF THE INVENTION

1. Field of the Invention

The present invention relates to a semiconductor device. More particularly, the present invention relates to a non-volatile memory (NVM) device and a manufacturing method and an operating method thereof.

2. Description of Related Art

Electrically erasable programmable read only memory (EEPROM) is a type of non-volatile memory that allows multiple data reading, writing and erasing operations. In addition, the stored data will be retained even after power to the device is removed. With these advantages, it has been broadly applied in personal computer and electronic equipment.

A typical flash memory device has a floating gate and a control gate fabricated using doped polysilicon, and the control gate is disposed directly above the floating gate. Further, the floating gate is isolated from the control gate with a dielectric layer, while the floating gate is isolated from the substrate with a tunnel oxide layer. With the control gate, the floating gate, the dielectric layer and the tunnel oxide layer, a stacked gate flash memory cell is provided.

FIG. 1 is a schematic cross-sectional view of a portion of a conventional stacked gate flash memory cell structure (refer to U.S. Pat. No. 6,214,668). As shown in FIG. 1, the conventional stacked gate flash memory cell structure includes a p-type substrate 100, a deep n-well region 102, a p-type pocket doped region 104, a stacked gate structure 106, a source region 108, a drain region 110, a spacer 112, an interlayer dielectric layer 114, a conductive plug 116 and a conductive line 118 (bit line). The stacked gate structure 106 is constituted with a tunnel oxide layer 120, a floating gate 122, a gate dielectric layer 124, a control gate 126 and a cap layer 128. The deep n-well region is disposed in the p-type substrate 100. The stacked gate structure 106 is positioned on the p-type substrate 100, while the source region 108 and the drain region 110 are configured in the p-type substrate beside two sides of the stacked gate structure 106. The spacer 112 is disposed on the sidewall of the stacked gate structure 106. The p-type doped region 104 is configured in the deep n-well 102 and is extended from the drain region 110 to the underneath of the stacked gate structure 106. The interlayer dielectric layer 114 is positioned on the p-type substrate 100. The conductive plug 116 penetrates through the interlayer dielectric layer 114 and the p-type substrate 100 to short the drain region 110 with the p-type packet doped region 104. The conductive line 118 is disposed on the interlayer dielectric layer 114 and is electrically connected with the conductive plug 116.

With the continuous miniaturization of semiconductor devices as the level of integration of integrated circuits increases, the dimension of memory cells must also reduces in order to increase the level of integration. According to the stacked gate flash memory cell in FIG. 1, reducing the dimension of a memory cell can be accomplished by reducing the gate length of the memory cell. However, when the gate length is being reduced, the channel length under the tunnel oxide layer is reduced correspondingly. Thus, an abnormal punch through between the source region and the drain region easily occurs, which greatly affect the electrical performance of the memory cell, Moreover, two neighboring memory cells may interfere with each other to slow down the operating speed of the device. Consequently the effect of the device is affected. Apart from the above-mentioned deficiencies, the reduction of the dimension of the flash memory is limited by the critical dimension of the photolithography process applied in the fabrication of the flash memory.

SUMMARY OF THE INVENTION

Accordingly, the present invention provides a non-volatile memory device and a fabrication method and an operating method thereof wherein the memory cell is formed inside a trench to reduce the dimension of the memory cell and to increase the level of integration.

The present invention also provides a non-volatile memory device and a fabrication method and an operating method thereof, wherein the process margin is increased, while the steps, the cost and the time of the manufacturing process are reduced.

The present invention provides a non-volatile memory device that includes a substrate, a first conductive type first well region, a second conductive type second well region, a pair of control gates, two composite dielectric layers, a source region and a pair of drain regions. The first conductive type first well region is disposed in the substrate. The second conductive type second well region is disposed above the first conductive type first well region. The first conductive type first well region further includes a trench therein, wherein the depth of the trench is greater than the depth of the second conductive type second well region. A pair of control gates is disposed on the two sidewalls of the trench. The two composite dielectric layers are disposed respectively between the pair of control gates and the substrate, wherein each composite dielectric layer further includes a charge storage layer. The source region is disposed between the pair of control gates in the substrate. The pair of drain regions is respectively disposed in the second conductive type second well region beside both sides of the trench.

In the above non-volatile memory device, the drain regions and the second conductive type second well region are electrically shorted. Further, the non-volatile memory device further includes a conductive plug that penetrates through the junction of the drain region and the second conductive type second well region. The source region and the drain region are doped with n-type ions, and the second conductive type second well region can be a p-type well region. The substrate can be a p-type substrate. The first conductive type first well region can be a deep n-type well region. The material of the charge storage layer includes silicon nitride or polysilicon, for example. A pair of conductive spacers is formed, in a self-aligned manner, on the pair of control gates, wherein the top part of the control gates is protruded above the top surface of the trench.

According to the present invention, the control gates and the composite dielectric layers are disposed in the trench. Comparing with the conventional non-volatile memory device, the use of the surface area of the substrate is reduced and the integration of the device is increased.

Additionally, the channel region of the non-volatile memory device of the present invention is disposed in the substrate (a vertical channel region) surrounding the peripheral of the trench. The channel length can be accurately controlled by controlling the depth of the trench to preclude the problems encountered during the miniaturization of devices.

Further, the non-volatile memory device of the present invention employs a charge storage layer (silicon nitride) as a unit for storing charges. As a result, the work voltage required during an operation can be reduced to raise the operating speed and efficiency of the memory cell and to enhance the performance of the programming/erasure operation of the memory device.

The reading operation of the non-volatile memory device of the present invention is accomplished by shorting the drain region and the second conductive type second well region. The reading rate can thus increase to improve the efficiency of the device.

The present invention is also directed to a non-volatile memory device that includes a substrate, a first conductive type first well region, a plurality of second conductive type second well regions, a plurality of control gates, a plurality of composite dielectric layers, a plurality of source regions and a plurality of drain regions. The first conductive type first well region is disposed in the substrate. The plurality of second conductive type second well regions is disposed above the first conductive type second well region. The first conductive type first well region includes a plurality of parallel-arranged trenches, and the depth of these trenches is greater than the depth of the second conductive type second well regions. The plurality of control gates is respectively disposed on the sidewalls of the trench. The plurality of composite dielectric layers is respectively disposed between the control gates and the substrate. Each composite dielectric layer is constituted with a top dielectric layer, a charge storage layer and a bottom dielectric layer. The plurality of source regions is respectively disposed in the substrate between two neighboring control gates in the trench. The plurality of drain regions is respectively disposed in the second conductive type second well region beside the two sides of the trench.

In the above non-volatile memory device, the drain regions and the second conductive type second well region are electrically shorted. Further, a plurality of conductive plugs is disposed in the device, wherein these conductive plugs respectively penetrate through the junction of the drain regions and the second conductive type second well region. The source regions and the drain regions are doped with n-type ions, and the second conductive type second well region is a p-type well region. The substrate is a p-type substrate. The first conductive type first well region can be a deep n-type well region. The material of the charge storage layer can be, for example, silicon nitride or polysilicon.

According to the present invention, the control gates and the composite dielectric layers are disposed in the trench. Therefore, comparing with the conventional non-volatile memory device, the application of the surface area of the substrate can be reduced to raise the integration of the device.

Additionally, the channel region of the non-volatile memory device of the present invention is disposed in the substrate (a vertical channel region) surrounding the peripheral of the trench. Therefore, the channel length can be accurately controlled by controlling the depth of the trench to preclude the problems encountered during the miniaturization of devices.

Further, the non-volatile memory device of the present invention employs a charge storage layer (silicon nitride) as a charge-storing unit. As a result, the work voltage required for an operation can be reduced to improve the operating speed and efficiency of the memory cell and to enhance the performance of the programming/erasure operation of the memory device.

The drain region and the second conductive type second well region of the present invention are shorted for reading the non-volatile memory device. Thus, the reading rate is increased to improve the efficiency of the device.

The present invention provides a fabrication method for a non-volatile memory device. This method includes providing a substrate and forming a first conductive type first well region in the substrate. A second conductive type second well region is then formed over the first conductive type first well region. A trench is also formed in the substrate, wherein the depth of the trench is greater than the depth of the second conductive type second well region. A composite dielectric layer is then formed on both sides of the trench. The composite dielectric layer includes a charge storage layer. A plurality of conductive spacers is formed on the sidewall of the trench, wherein the composite dielectric layer is formed between the conductive spacers and the sidewalls of the trench. Thereafter, a source region and a drain region are formed in the substrate. The source region is formed in the substrate at a bottom of the trench between two neighboring conductive spacers, while the drain region is formed in the substrate above the second conductive type second well region.

In the above fabrication method for a non-volatile memory device, after forming the source region and the drain region in the substrate, the method farther includes forming an interlayer dielectric layer in the substrate to cover the substrate, the trench and the conductive spacers. An opening that at least exposes the drain region is formed in the interlayer dielectric layer. Thereafter, a conductive plug is formed by filling the opening with a conductive material. Forming the opening that at least exposes the drain region includes removing a portion of the substrate such that the opening extends to the junction of the drain region and the second conductive type second well region.

In the above fabrication method for a non-volatile memory device, before the step of forming the conductive spacers on the sidewalls of the trench, a conductive layer is first formed on the substrate, followed by performing an anisotropic etching process to remove a portion of the conductive layer. Further, a portion of the composite dielectric layer is concurrently removed. The material of the charge storage layer includes silicon nitride and polysilicon.

The conductive spacers (control gate) of the present invention is formed by a self-alignment method without the application of the photolithography techniques. Not only the process margin is increased, the manufacturing cost and time are reduced.

The conductive spacers (control gate) and the composite dielectric layer of the present invention are formed in the trench. Comparing with the conventional nonvolatile memory device, the use of the surface area of the substrate is reduced. As a result, the level of integration is increased. Moreover, the present invention employs the charge storage layer (silicon nitride) as the charge storage unit. Therefore, the process for defining the floating gate when a floating gate (doped polysilicon) is used as a charge-storing unit can be omitted. Accordingly, the fabrication process of the present invention is simpler and the level of integration of the non-volatile memory device can be increased.

The present invention further provides an operating method for a non-volatile memory device, and the method includes applying a first voltage to the control gate, applying a second voltage to the drain region, applying a third voltage to the source region, and using the channel F-N tunneling effect to program the memory cell.

In the above operating method of a non-volatile memory device, the first voltage is about −10 volts, the second voltage is about 6 volts and the third voltage is about 6 volts.

In the above operating method of a non-volatile memory device, during a reading operation, a fourth voltage is applied to the control gate, a fifth voltage is applied to the source region and a sixth voltage is applied to the drain region to read the memory cell.

In the above operating method of a non-volatile memory device, the fourth voltage is about 3.3 volts, the fifth voltage is about 1.65 volts and a sixth voltage is about 0 volt.

In the above operating method of a non-volatile memory device, during an erasure operation, a seventh voltage is applied to the control gate, a drain region is set at floating, an eighth voltage is applied to the source region, and a ninth voltage is applied to the substrate to erase the memory cell using the channel F-N tunneling effect.

In the above operating method of a non-volatile memory device, the seventh voltage is about 10 volts, the eighth voltage is about −6 volts, and the ninth voltage is about −6 volts.

The programming and the erasure operations of a non-volatile memory device of the present invention applies the channel F-N tunneling effect. Therefore, the consumption of electric current is small and the power dissipation of the entire wafer is effectively lowered. Moreover, during the programming operation, using channel F-N tunneling with a higher electron injection efficiency can lower the memory current and increase the operating speed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
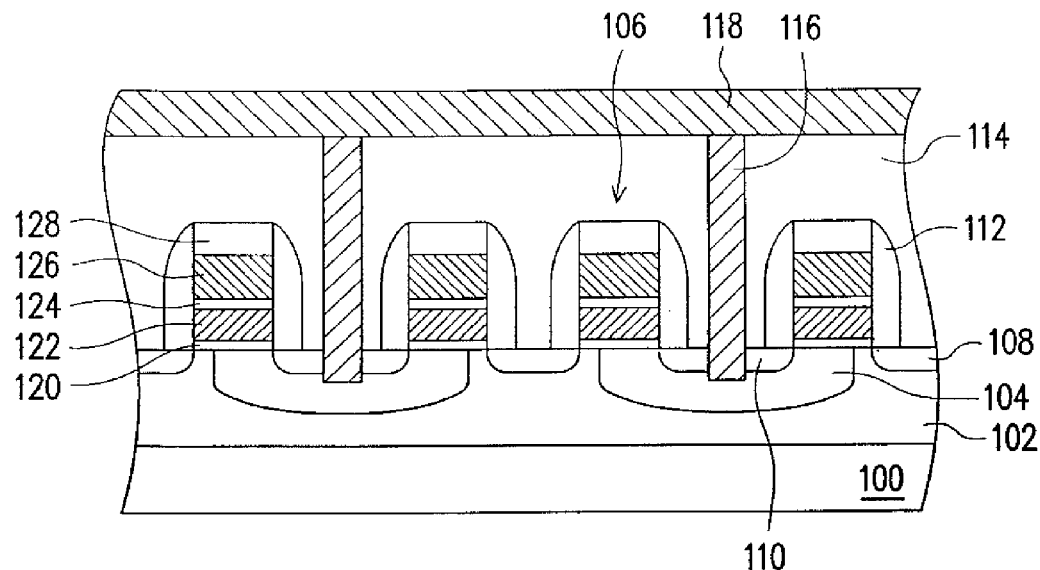
FIG. 1 is a schematic, cross-sectional view of a portion of a conventional stacked gate type of flash memory cell structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
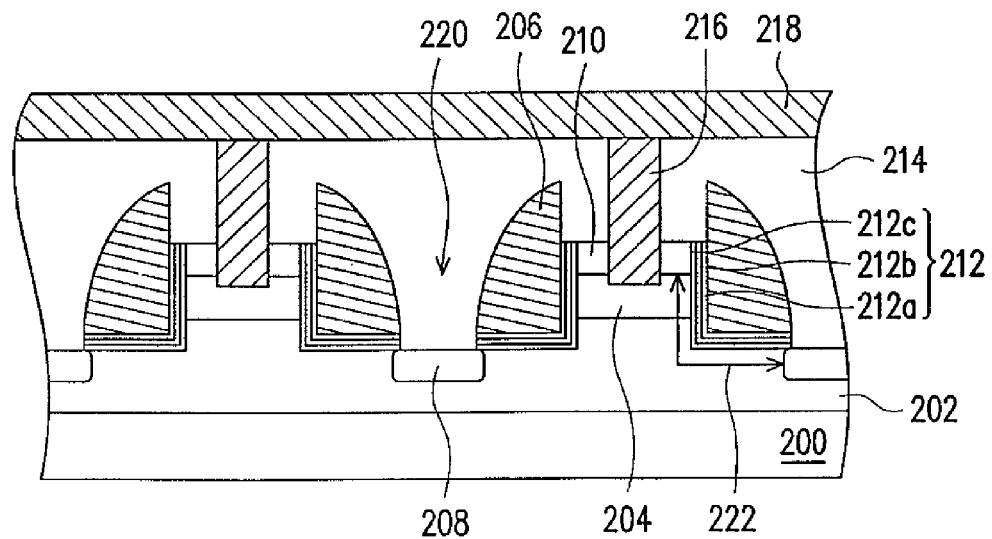
FIG. 2 is a schematic, cross-sectional view of a non-volatile memory device structure according to an embodiment of the present invention.

FIG. 2 is a schematic, cross-sectional view of a non-volatile memory device structure. The following discussion will be based on a bi-directional tunneling program/erase NOR (BiNOR) array of non-volatile memory for illustration.

Referring to FIG. 2, the non-volatile memory device of the present invention is formed with a p-type substrate 200, a deep n-type well region 202, a p-type well region 204, a control gate 206, a source region 208, a drain region 210, a composite dielectric layer 212, an interlayer dielectric layer 214, a conductive plug 216, a conductive line 218 (bit line).

The p-type substrate 200 includes a plurality of parallel arranged trenches 220. The deep n-type well 202 is positioned, for example, in the p-type substrate 200. The p-type well region 204 is disposed, for example, above the n-type well region 202, and is arranged between every two neighboring trenches 220 in the substrate 200. Thus, the p-type well 204 is an isolated well. The junction of the deep n-type well region 202 and the p-type well region 204 is higher than the bottom of the trench 220. The depth of the trench 220 is greater than the depth of the p-type well region 204.

The control gate 206 is disposed, for example, on the two sidewalls of the trench 220, wherein the top of the control gate 206 is protruded from the surface of the substrate 200. The composite dielectric layer 212 is disposed, for example, between the control gate 206 and the substrate 200. The composite dielectric layer 212 includes a top dielectric layer 212a, a charge storage layer 212b and a bottom dielectric layer 212c, for example. The material of the top dielectric layer 212a includes, but not limited to, silicon oxide. The material of the charge storage layer 212b is, for example, silicon nitride. The material of the bottom dielectric layer 212c includes, but not limited to, silicon oxide. The material of the charge storage layer 212b can be other material that includes the charge storage property, such as polysilicon, silicon oxynitride, etc.

The source region 208 is disposed, for example, beside one side of the control gate at the bottom of the trench 220. In other words, the source region 208 is disposed in the substrate 200 between two neighboring control gates 206 in the trench 220. The source regions 208 are connected together through the n-type well region 202 to form the common source line. The drain region 210 is disposed, for example, beside another side of the control gate 206 in the substrate 200. In other words, the drain region 210 is disposed beside the two sides of the trench 220 in the p-type well region 204.

The interlayer dielectric layer 214 is disposed on the p-type substrate 200. The conductive plug 216 penetrates through the interlayer dielectric layer 214 and the p-type substrate 200, shorting the drain region 210 and the p-type well region 204. The conductive line 218 is disposed above the interlayer dielectric layer 214 and is electrically connected with the conductive plug 216.

The control gate 206 and the composite dielectric layer 212 of the present invention are disposed in the trench 220. Therefore, comparing with the conventional non-volatile memory device, the use of the substrate surface area can be reduced to increase the level of integration of the device.

Further, the channel region (vertical type of channel region 222) of the non-volatile memory device of the present invention is disposed surrounding the peripheral of the trench in the substrate. Thus, the channel length can be accurately controlled by controlling the depth of the trench to avoid problems generated during the miniaturization of devices.

Further, the non-volatile memory device of the present invention utilizes the charge storage layer (silicon nitride) as the charge-storing unit. Not only the work voltage required for operation can be lower, the operating speed and efficiency of the memory cell can be increased to enhance the performance of the programming/erasure operation of the memory device.

Moreover, the reading operation of the non-volatile memory device is accomplished by shorting the p-type well region 204 and the drain region 210. Accordingly, the reading rate is increased and the performance of the device is enhanced.

The fabrication method for a non-volatile memory device according to an embodiment of the invention is discussed hereinafter. FIGS. 3A through 3F are schematic cross-sectional views showing the steps for fabricating a flash memory device according to an embodiment of the present invention. The following discussion will be based on a BiNOR array of non-volatile memory for illustration.

Figure 3A:
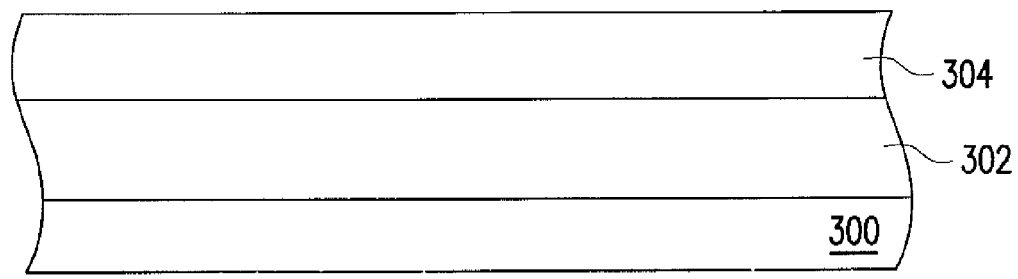
FIGS. 3A through 3F are schematic cross-sectional views showing the steps for fabricating a flash memory device according to an embodiment of the present invention.

Referring to FIG. 3A, a p-type substrate 300 is provided. The p-type substrate 300 is already completed with device isolation structures (not shown). The device isolation structures are arranged in a strip pattern to define the active region. The method used in forming the device isolation structures includes, local oxidation (LOCOS) or shallow trench isolation (STI). Thereafter, a deep n-type well region 302 is formed in the p-type substrate 300, followed by forming a p-type well region 304 above the n-type well region 302. The deep n-type well region 302 and the p-type well region 304 are formed by ion implantation, for example.

Figure 3B:
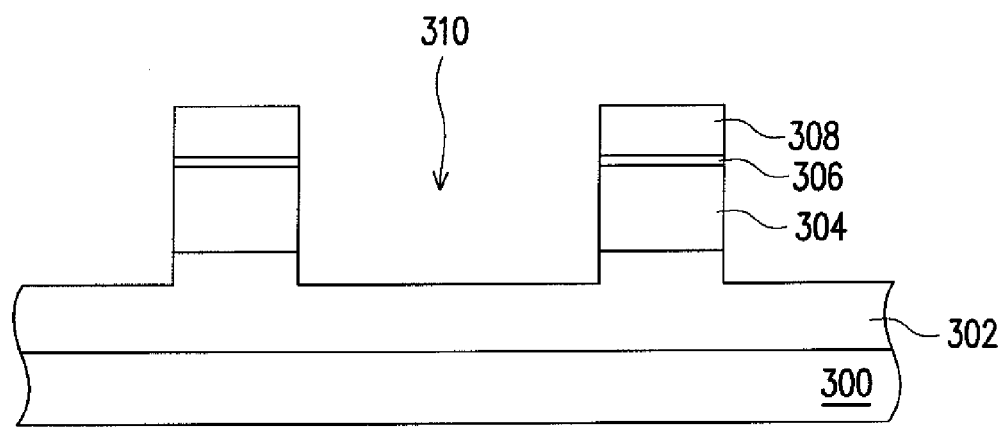

Referring to FIG. 3B, a pad oxide layer 306 and a mask layer 308 are sequentially formed on the surface of the substrate 300. Photolithography and etching processes are performed to pattern the mask layer 308 and the pad oxide layer 306 to form an opening (not shown in Figure) that exposes the substrate 300. The pad oxide layer 306 includes silicon oxide, for example, and is formed by methods such as thermal oxidation. The material of the mask layer 308 is silicon nitride, for example. Forming the mask layer 308 includes, but not limit to, performing chemical vapor deposition (CVD).

Using the mask layer 308 as a mask, an etching process is performed to form a trench 310 in the substrate 300. The depth of the trench 310 is greater than the depth of the p-type well region 304. Etching the trench 310 in the substrate 300 includes performing dry etching, such as, reactive ion etching.

Figure 3C:
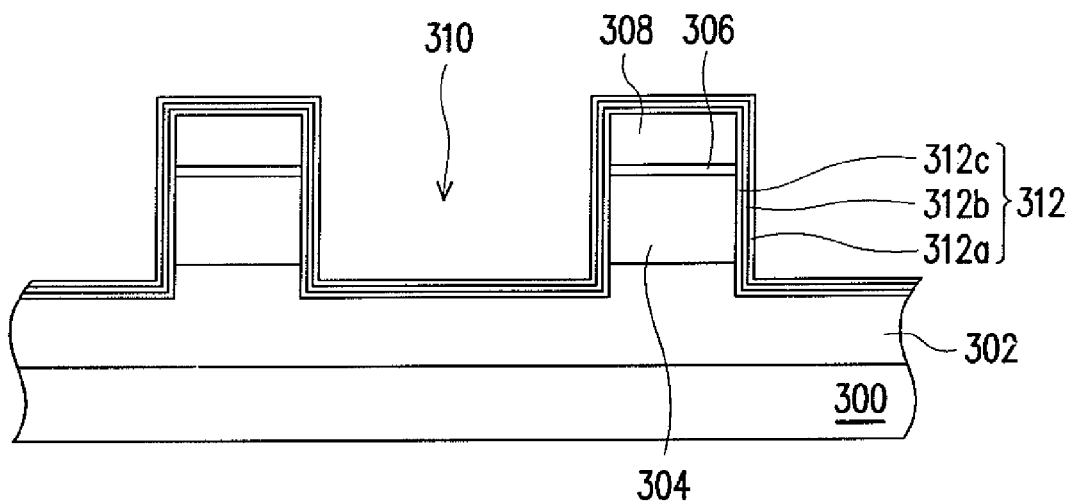

Continuing to FIG. 3C, a composite dielectric layer 312 is formed on the substrate 300. The composite dielectric layer 312 includes a top dielectric layer 312a, a charge storage layer 312b and a bottom dielectric layer 312c. The material of the top dielectric layer 312a includes silicon oxide, for example. The material of the charge storage layer 312b includes silicon nitride, for example. The material of the bottom dielectric layer 312c includes silicon oxide, for example. The composite dielectric layer 212 is formed by, for example, using a thermal oxidation method to form the bottom dielectric layer 312c, followed by using a chemical vapor deposition method to form the charge storage layer 312b and the top dielectric layer 312a.

Figure 3D:
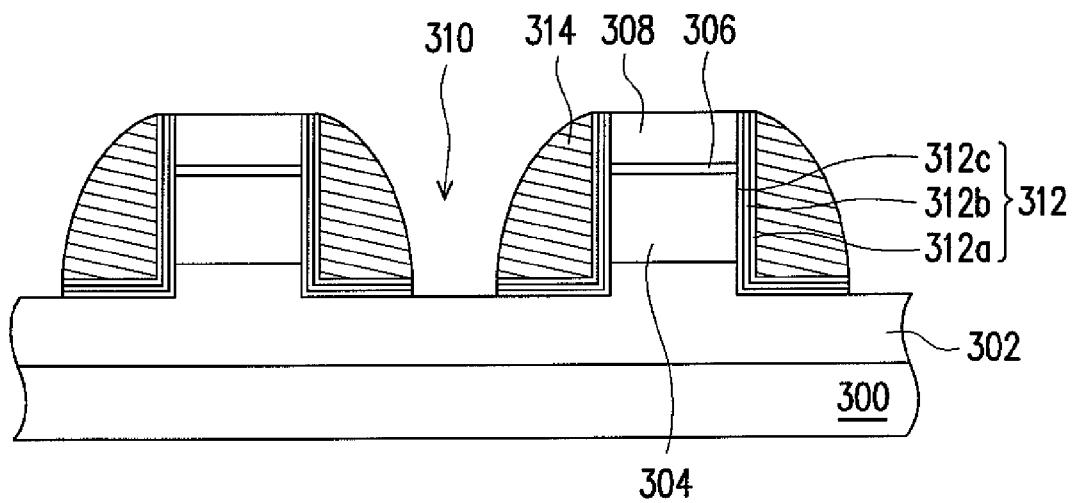

Thereafter, as shown in FIG. 3D, a plurality of conductive spacers 314 is respectively formed on the sidewalls of the trench 310, wherein the conductive spacer 314 serve as the control gates. The conductive spacers 314 are formed by, for example, forming a conductive layer, followed by performing an anisotropic etching process to remove a portion of the conductive layer. The material of the conductive layer (conductive spacer 314) includes doped polysilicon, which is formed by, for example, performing a chemical vapor deposition process to form an undoped polysilicon layer, followed by conducting an ion implantation process. The conductive layer can also form by an in-situ doping during a chemical vapor deposition process. In the step of forming the conductive spacer 314, portions of the composite dielectric layer 312 on the surface of the mask layer 308 and between the conductive spacers 314 are removed, leaving behind the composite dielectric layer 312 between the conducive spacers 314 and the sidewall of the trench.

Figure 3E:
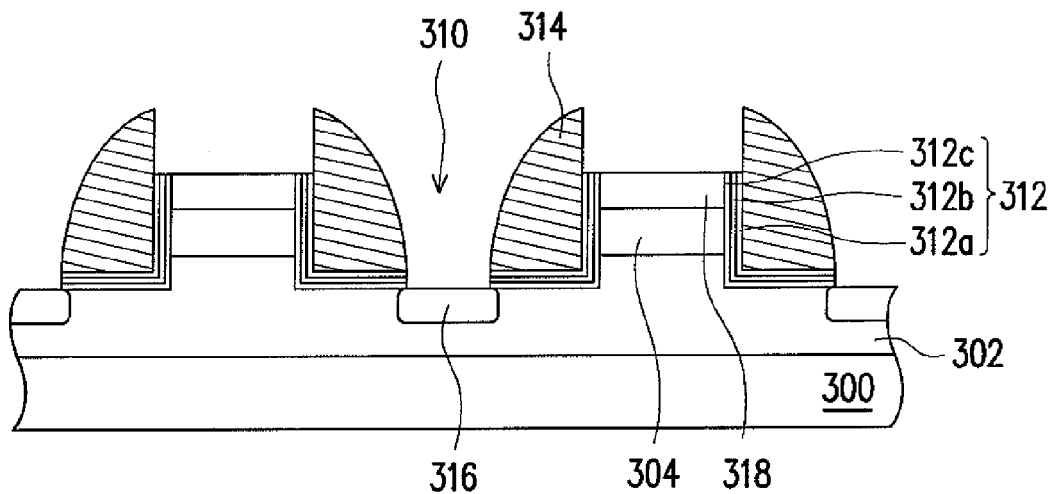

As shown in FIG. 3E, after removing the mask layer 308 and the pad oxide layer 306, an ion implantation process is performed to form a source region 316 and a drain region 318 in the substrate 300 using the conductive spacers 314 as a mask. The source region 316 is disposed in the substrate 300 between the conductive spacers 314 at the bottom of the trench 310. The drain region 318 is disposed above the p-type well region 304 in the substrate 300.

Figure 3F:
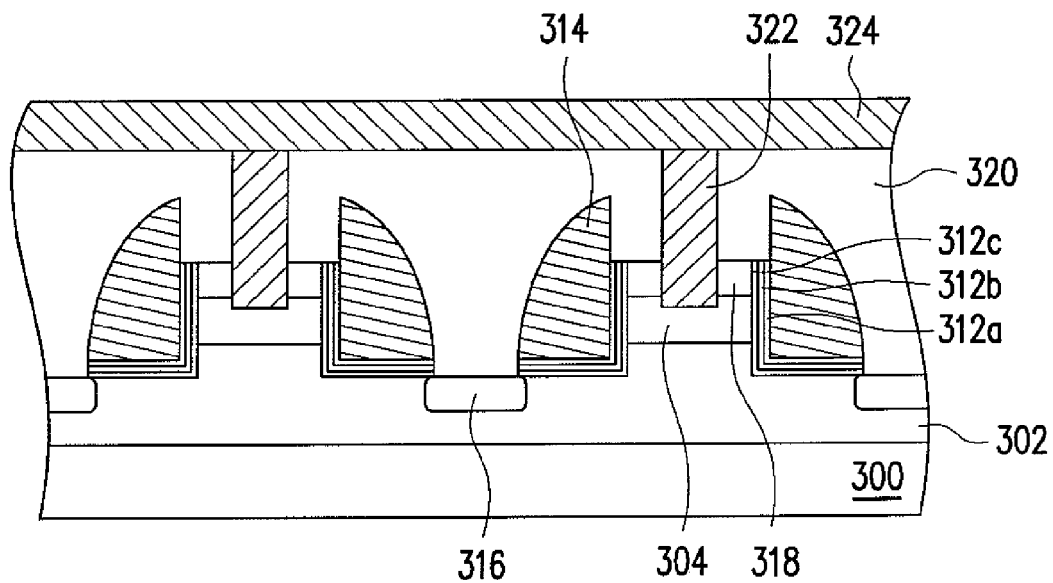

Referring to FIG. 3F, an interlayer dielectric layer 320 is formed on the substrate 320. The interlayer dielectric layer 320 is formed with borophosphosilicate glass (BPSG) or phosphosilicate glass (PSG). The interlayer dielectric layer 320 is formed by, for example, chemical vapor deposition. Thereafter, a planarization process (for example, etching-back, chemical mechanical polishing) is performed to planarize the surface of the interlayer dielectric layer 320. A conductive plug 322 is then formed in the interlayer dielectric layer 320. The conductive plug 322 is formed with, for example, tungsten. The conductive plug 322 is formed by, forming an opening (not shown) that exposes the drain region 318 in the interlayer dielectric layer 320, followed by filling the opening with a conductive material. Further, during the step of forming the opening that exposes the drain region in the interlayer dielectric layer 320, a portion of the substrate at the drain region 318 is removed such that the opening is formed penetrating through the junction of the drain region 318 and the p-type well region 304. In other words, the conductive plug 322 penetrates through the junction of the drain region 318 and the p-type well region 304 to electrically short the drain region 318 and the p-type well region 304. A conductive line 324 is then formed on the interlayer dielectric layer 320 to electrically connect with the conductive plug 322. The conductive line 324 is formed by, for example, forming a conductive layer (not shown) on the substrate 300, followed by performing photolithography and etching processes to form the strip-shape pattern conductive line 324. The fabrication of a flash memory device is subsequently formed by resorting to the conventional techniques and will not be reiterated herein.

The formation the conductive spacer 314 (control gate) can be formed by a self-aligned method without the application of the photolithography techniques. Not only the process margin can be increased, the manufacturing cost and time can be increased.

Moreover, the conductive spacer 314 (control gate) and the composite dielectric layer 312 of the present invention are formed in the trench 310. Comparing with the conventional non-volatile memory device, the usage of the substrate surface can be reduced to increase the level of integration. Moreover, the present invention applies a charge storage layer (silicon nitride) as a charge-storing unit. Therefore, the step for defining a floating gate when a floating gate is used for a charge-storing unit can be omitted, Not only the manufacturing process of this invention is simpler, the level of integration of the non-volatile memory device is increased.

Although the disclosure herein refers to certain illustrated embodiments of a n-channel non-volatile flash memory device, it is to be understood that these embodiments can also be presented by way of an p-channel non-volatile memory device.

Figure 4:
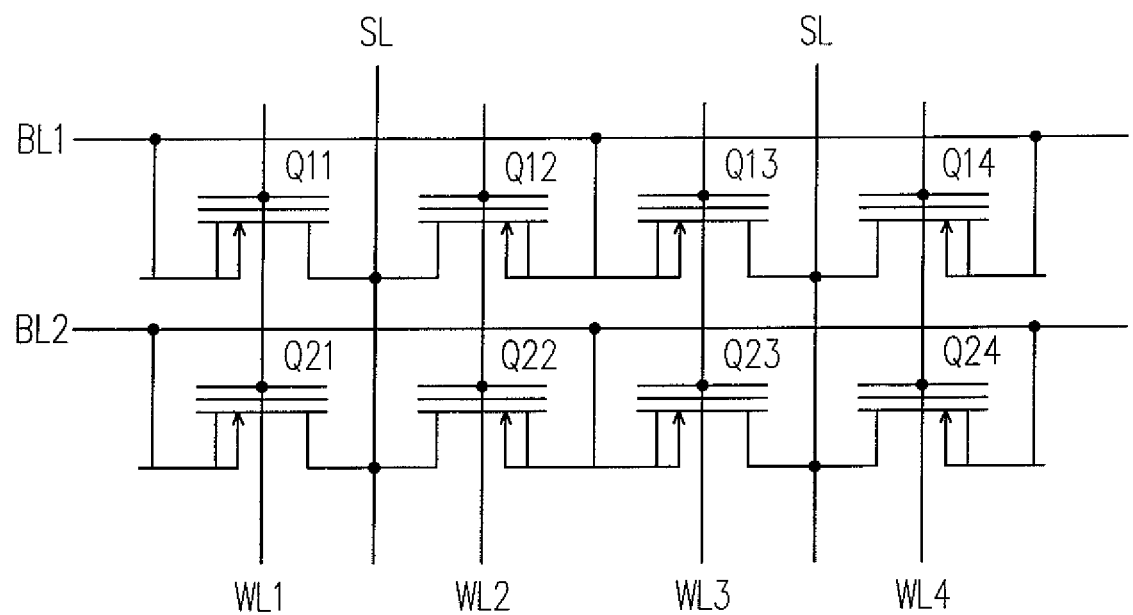
FIG. 4 is a simplified circuit diagram of a non-volatile memory device according to an embodiment of the present invention.

FIG. 4 is a simplified circuit diagram of a non-volatile memory device according to an embodiment of the present invention. The disclosure herein refers to an eight-memorycell array of a bi-directional tunneling program/erase NOR (BiNOR) type for illustrating the operations of the memory array of the present invention.

Referring to FIG. 4, the memory array includes 8 memory cells Q11~Q24, the word line WL1~WL4, the bit line BL1~BL2, and the common source line SL.

Each memory cell Q11~Q24 has a structure as shown in FIG. 2. Two neighboring memory cells share a drain region. The two memory cells that do not share a drain region share a source region.

The bit lines BL1~BL2 are respectively connected to the drain regions of the same row of memory cells. For example, the bit line BL1 connects the drain regions of the memory cells Q11~Q14, while the bit line BL2 connects the drain regions of the memory cells Q21~Q24.

The word lines WL1~WL4 are respectively connected to control gates of the memory cells of the same column. For example, the word line WL1 connects the control gates of the memory cells Q11~Q21, the word line WL2 connects the control gates of the memory cells Q12~Q22, the word line WL3 connects the control gates of the memory cells Q13~Q23, and the word line WL4 connects the control gates of the memory cells Q14~Q24. The source regions of all memory cells are connected together through the deep n-type well region to form a common source line SL.

Concurrently referring to FIG. 4 and Table 1, FIG. 4 and Table 1 illustrate the operation which include the programming, the erasure and the reading operations of the non-volatile memory device of the present invention.

TABLE 1

| | Programming | Erasure | Reading |
|---|---|---|---|
| Selected word line WL2 | Vgp (−10 V) | Vge (10 V) | Vgr (3.3 V) |
| Non-selected word line WL1, WL3, WL4 | Vg (−2 V) | Vge (10 V) | 0 |
| Selected bit line BL2 | Vdp (6 V) | Floating | 0 |
| Non-selected bit line BL1 | 0 | Floating | Floating |
| Source line, SL | Vsp (6 V) | Vse (−6 V) | Vsr (1.65 V) |
| Substrate | 0 | Vbe (−6 V) | 0 |

Referring to FIG. 4, when the memory cell Q22 is performing a programming operation, a voltage Vgp, for example, −10 volts is applied to the selected word line WL2. A bias voltage Vdp, for example, −2 volts, is applied to other non-selected word lines WL1, WL3, WL4. A voltage Vdp, for example, 6 volts, is applied the selected bit line BL2, while a voltage of 0 volt is applied to the non-selected bit line BL1. A bias voltage Vsp, for example, 6 volts, is applied to the source line. Under these types of bias voltages, the channel F-N tunneling effect can be used to inject electrons into the charge storage layer to program the memory cell Q22.

During the above-mentioned programming operation, the memory cell Q12 that share the common word line WL2 with the memory cell Q22 is not programmed. This is due to the fact that a voltage of 0 volt is applied to the bit line and the channel F-N tunneling effect will not be invoked. Accordingly, the memory cell Q12 is not programmed.

A voltage of −2 volts applied to the non-selected word lines WL1, WL3, WL4 is not sufficient to invoke the channel F-N tunneling effect. The memory cells Q11~Q21, Q13~Q23, Q14~Q24 that are connected by the non-selected word lines WL1, WL3, WL4 are not programmed.

Although the above-mentioned programming operation is performed on a single memory cell in the memory device array, the programming of the non-volatile memory device of the present invention can be conducted in byte or page by controlling the various word lines, source lines and bit lines.

To read the information in memory cell Q22, a bias voltage of Vgr, for example, about 3.3 volts, is applied to the selected word line WL2, while 0 volt is applied to other non-selected word lines WL1, WL3, WL4. The selected bit line BL2 is applied with about 0 volt, while the non-selected bit line BL1 is set floating. The source line SL is supplied with a bias voltage of about 1.65 volts, for example. Since the channel of the memory cell having charges being stored in the charge storage layer is closed and there is no current flow and the channel of memory cell having no charges being stored in the charge storage layer is opened and the current flow is large, the digital information stored in the memory cell being [1] or [0] can be determined by the opening or closing/the amount of current flow at the channel of the memory cell.

Although the above-mentioned reading operation is performed on a single memory cell in the memory device array, the reading of the non-volatile memory device of the present invention can be conducted in terms of byte, sector or block by controlling the various word lines, source lines and bit lines.

The erasure method of the non-volatile memory device of the present invention is disclosed hereinafter. As shown in Table 1, the erasure method of the present invention is directed to, as an example, the entire non-volatile memory device.

As the memory cell is performing the erasure operation, a bias voltage Vge, for example, about 10 volts, is applied to all the word lines WL1~WL4, while the bit lines are set floating. A bias voltage Vse, for example, about −6 volts, is applied to the source line SL. A bias voltage Vbe, for example, about −6 volts, is applied to the substrate. Since the voltage applied between the control gate and the substrate is sufficient to establish a large electric field between the control gate and the substrate, the channel F-N tunneling effect can be used to expel the charges from the charge storage layer and to remove the charges by injecting the charges into the substrate.

Although the above-mentioned erasure operation is performed on the entire memory device array, the erasure of the non-volatile memory device of the present invention can be conducted in sector or block by controlling the various word lines, source lines and bit lines.

Since the programming and the erasure operations of the non-volatile memory device utilize the channel F-N tunneling effect, the current consumption is small to effectively lower the power dissipation of the entire memory array. Moreover, during the programming operation, using channel F-N tunneling with a higher electron injection efficiency can lower the memory current and to increase the operating speed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a non-volatile flash memory device, the method comprising:
   providing a substrate;
   forming a first conductive type first well region in the substrate;

forming a second conductive type second well region above the first conductive type first well region;

forming a trench in the substrate, wherein a depth of the trench is greater than a depth of the second conductive type second well region;

forming a composite dielectric layer at both sides of the trench, wherein the composite dielectric layer comprises a charge storage layer;

forming a pair of conductive spacers on sidewalls of the trench, wherein the composite dielectric layer is disposed between the conductive spacers and the sidewall of the trench; and forming a source region and a pair of drain regions in the substrate, wherein the source region is formed in the substrate between two of the neighboring conductive spacers, and the drain regions are formed on two sides of the trench in the second conductive type second well region.

2. The method of claim 1, wherein after the step of forming the source region and the drain regions in the substrate, the method further comprises:

forming an interlayer dielectric layer on the substrate to cover the substrate, the trench and the conductive spacers;

forming an opening in the interlayer dielectric layer, wherein the opening at least exposes the drain region; and filling a conductive material into the opening to form a conductive plug.

3. The method of claim 2, wherein in the step of forming the opening in the interlayer dielectric layer, the opening further exposes a part of the second conductive type second well region.

4. The method of claim 1, wherein the step of forming the pair of conductive spacers on the sidewall of the trench further comprises:

forming a conductive layer on the substrate; and performing an anisotropic etching process to remove a portion of the conductive layer.

5. The method of claim 4, wherein the step of performing the anisotropic etching process to remove the portion of the conductive layer further comprises removing a portion of the composite dielectric layer.

6. The method of claim 1, wherein a material constituting the charge storage layer comprises silicon nitride.

7. The method of claim 1, wherein a material constituting the charge storage layer comprises polysilicon.

* * * * *